US006534337B1

United States Patent
Mahle et al.

(10) Patent No.: US 6,534,337 B1
(45) Date of Patent: Mar. 18, 2003

(54) LEAD FRAME TYPE PLASTIC BALL GRID ARRAY PACKAGE WITH PRE-ASSEMBLED BALL TYPE CONTACTS

(75) Inventors: Richard L. Mahle, Dallas, TX (US); John W. Orcutt, Richardson, TX (US); Randall V. Tekavec, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/080,070

(22) Filed: May 15, 1998

Related U.S. Application Data
(60) Provisional application No. 60/046,550, filed on May 15, 1997.

(51) Int. Cl.[7] .............................................. H01L 23/34
(52) U.S. Cl. ...................................... 438/106; 438/108
(58) Field of Search ................................. 438/106, 108, 438/615; 425/412; 257/738; 228/180.22

(56) References Cited

U.S. PATENT DOCUMENTS

| | | | | |
|---|---|---|---|---|
| 4,069,000 A | * | 1/1978 | Hampshire | 425/395 |
| 5,244,838 A | * | 9/1993 | Casati et al. | 437/212 |
| 5,293,072 A | * | 3/1994 | Tsuji et al. | 257/737 |
| 5,635,755 A | * | 6/1997 | Kinghorn | 257/666 |
| 5,656,863 A | * | 8/1997 | Yasunaga et al. | 257/778 |
| 5,783,461 A | * | 7/1998 | Hembree | 438/17 |
| 5,847,455 A | * | 12/1998 | Manteghi | 257/737 |
| 5,893,724 A | * | 4/1999 | Chakravorty et al. | 438/108 |
| 5,923,954 A | * | 7/1999 | Cho | 438/108 |
| 5,925,934 A | * | 7/1999 | Lim | 257/778 |
| 5,930,603 A | * | 7/1999 | Tsuji et al. | 438/127 |
| 5,982,026 A | * | 11/1999 | Tsunoda | 257/666 |
| 5,989,935 A | * | 11/1999 | Abbott | 438/106 |

* cited by examiner

*Primary Examiner*—Richard Elms
*Assistant Examiner*—Beth E. Owens
(74) *Attorney, Agent, or Firm*—Wade James Brady, III; Frederick J. Telecky, Jr.

(57) ABSTRACT

A method of making a ball grid array package wherein there is provided a partially fabricated package including a semiconductor die, leads and balls secured to predetermined ones of the leads. The leads and balls are concurrently coated with palladium. The die, leads and at least a portion of each of the balls are then encapsulated. Encapsulation includes providing a mold including a plurality of recesses, each recesses for receiving one of the balls. A plurality of cavities is provided in the package, each extending to one of the leads at the location of one of the balls. A plurality of mold members is provided, each extendable into one of the cavities to apply a force against the ball associated with the lead to which the cavity extends. The partially fabricated package is placed into the mold so that the balls extend into the recesses and the mold members extends into the cavities. The molding material is applied to the mold cavity to provide the encapsulation.

12 Claims, 2 Drawing Sheets

LEAD FRAME TYPE PLASTIC BALL GRID ARRAY PACKAGE WITH PRE-ASSEMBLED BALL TYPE CONTACTS

This application claims priority under 35 USC § 119(e)(1) of provisional application No. 60/046,550 filed May 15, 1997.

BACKGROUND OF THE INVENTION

1. Field of the Invention

This invention relates to a method of fabricating a ball grid array for use in conjunction with semiconductor devices.

2. Brief Description of the Prior Art

Plastic ball grid array packages are well known in the prior art. In general, such packages include a printed wiring board having a top surface to which a semiconductor die is secured and a reverse surface. Electrically conductive traces are positioned on the printed wiring board top surface and are spaced from the die with wire bonds extending from the pads on the die to the traces. Vias extend through the printed wiring board and couple traces on the printed wiring board with traces on the opposing or reverse surface of the printed wiring board. A potting agent or plastic encapsulant is disposed over the die, wire bond and a portion of the trace on the top surface. Cleaning then takes place to remove contamination so that solder balls can be attached to the leads or traces by reflow soldering. The solder ball is formed in standard manner and secured to each trace on the reverse side of the printed wiring board, preferably over the via. Testing and inspection then takes place. The package is soldered to a circuit in standard manner by proper positioning and heating and/or soldering of the solder ball in standard manner. An advantage provided by use of the balls is that the balls attract the solder by a wicking action due to their circular shape and thereby provide a highly reliable and relatively strong solder connection.

A problem with the above described approach is that it does not utilize standard semiconductor fabrication processes and therefore requires an entirely separate process and equipment for such fabrication. A further problem with this prior art plastic ball grid array package is that the procedure requires a sizable number of costly fabrication steps, resulting in relatively high fabrication costs. It follows that a procedure for fabrication of the ball grid array is required which will result in lower costs.

SUMMARY OF THE INVENTION

In accordance with the present invention, a ball grid array assembly is provided which is fabricated at far lower cost than that of the prior art using existing QFP processes and equipment.

Briefly, the balls, which are formed of an electrically conductive material, preferably copper or steel, and preferably capable of accepting a nickel plating, are initially attached to standard QFP lead frame leads (it being understood that lead traces on the printed wiring board or package can be substituted for the lead frame leads herein) in standard manner, such as, for example, by welding, brazing or soldering. The balls and lead frame are then plated, generally with a layer of nickel followed by a layer of palladium, prior to commencement of fabrication of the package. This preplates the balls as well as the lead frame or traces before the assembly process. The die attach step then takes place on the lead frame with subsequent wire bonding of wire between die pads on the die and the lead frame leads in the standard manner. Then encapsulation takes place by molding in a mold cavity with the balls generally protruding from the encapsulant. The flash over the balls, if any, is then removed by a simple abrading or etching procedure which insures that the lead frame/ball plating initially placed over the lead frame and balls is retained. Package singulation, testing and inspection then takes place. It can be seen that standard semiconductor leadframe processing procedures as opposed to those procedures normally used for fabrication of ball grid arrays have been used to obtain the final ball grid array package in accordance with the present invention with the only change required being that of securing the balls to the lead frame lead finger before leadframe plating and removal of any mold flash over the balls. Also, as will be explained hereinbelow, a slightly modified mold cavity is required for performance of the molding operation.

DESCRIPTION OF THE PREFERRED EMBODIMENT

Figure 1:
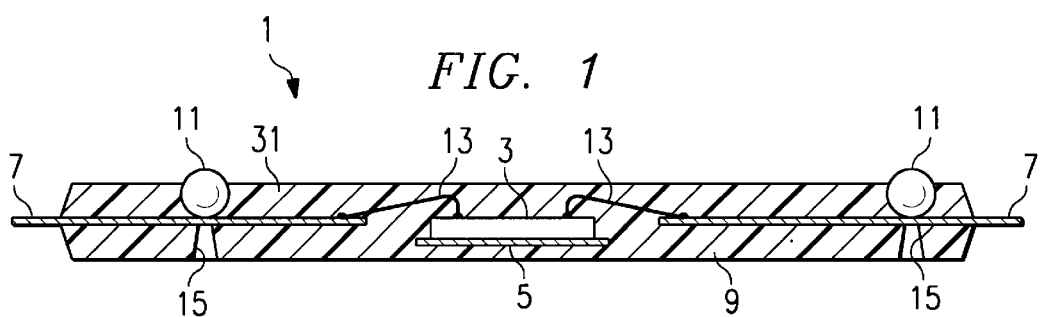
FIG. 1 is a cross section diagram of a fabricated package in accordance with the present invention.

Referring first to FIG. 1, there is shown a fabricated package 1 which contain the semiconductor die 3 with the lead frame which includes die pad 5 to which the die has been attached in standard manner and the lead frame leads 7, all secured in molded package 9. The only fabrication difference at this point in the fabrication procedure relative to the plastic QFP prior art is that the lead frame in accordance with the present invention includes electrically conductive copper balls 11 which are initially secured to the lead frame leads 7 by a conventional method such as, for example, brazing, soldering or welding prior to commencement of the packaging operation. The lead frame and balls are at this time finished with nickel and palladium in standard manner. Bond pads (not shown) on the die 3 are connected to lead frame leads 7 by wires 13 which are bonded between the die pads and the leadframe leads in standard manner, such as, for example, using ball and stitch bonds. The molded package 9 also includes apertures 15 therein beneath each ball 11 and extending to the lead frame lead 7 beneath the associated ball for reasons which will be discussed hereinbelow. It follows that, at this point in the fabrication process, the steps of attaching the balls and plating the balls and lead frame as opposed to only the lead frame with palladium and nickel have been added, however these steps as well as additional steps are required later in the prior art fabrication process as will be explained.

Figure 2:
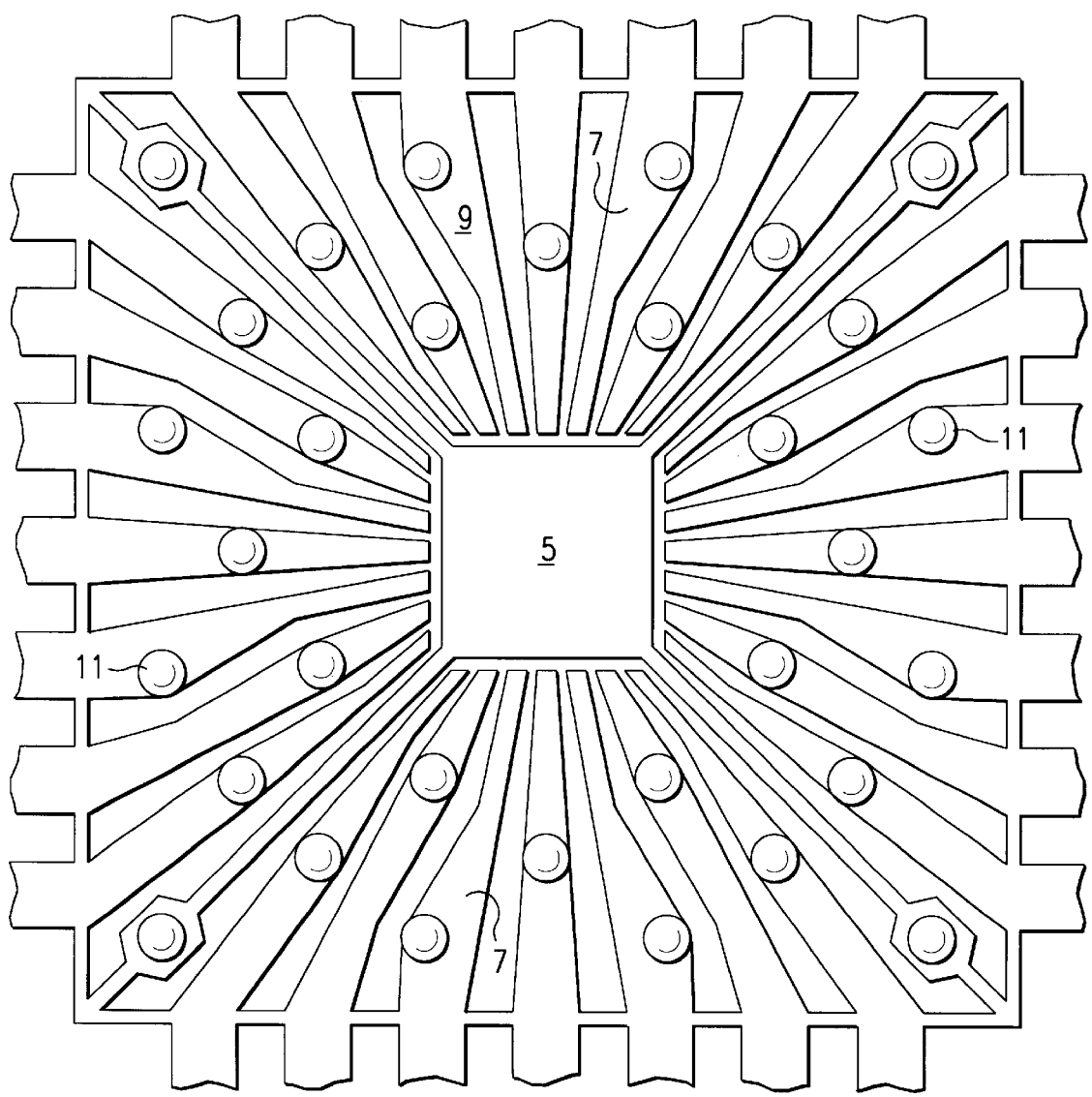
FIG. 2 is a plan view of the diagram of FIG. 1 with the package still in its leadframe format.

As can be seen in FIG. 2, wherein the die 3 and wires 13 have been removed, the lead frame leads 7 fan out so that the balls 11 secured thereto are staggered in some manner on the leads to be at least a predetermined minimum distance apart to allow proper board attach.

In accordance with the present invention, die attach of die 3 to the package 1 containing the lead frame die pad 5 and lead frame leads 7 with attached balls 11 as described above now takes place, wires 13 are bonded between die pads on the die 3 and the lead frame leads 7 and a standard plastic encapsulant for semiconductor devices, generally an epoxy, is then molded over the package as is explained in detail hereinbelow. Any plastic flash over the balls is removed to expose the balls and the package is then singulated, tested and inspected in standard manner. This is the same as the prior art method except that the step of removing the flash which may form over the balls takes place at this point in the process and the tooling in the form of the mold is slightly altered relative to the QFP prior art. However, the package is now completed in accordance with the present invention whereas additional processing is now required to provide the ball grid array in accordance with the ball grid array prior art. As can be seen, normal plastic semiconductor assembly fabrication techniques are used throughout the process with additional step of flash removal as opposed to the ball grid array fabrication techniques of the prior art.

Figure 3:
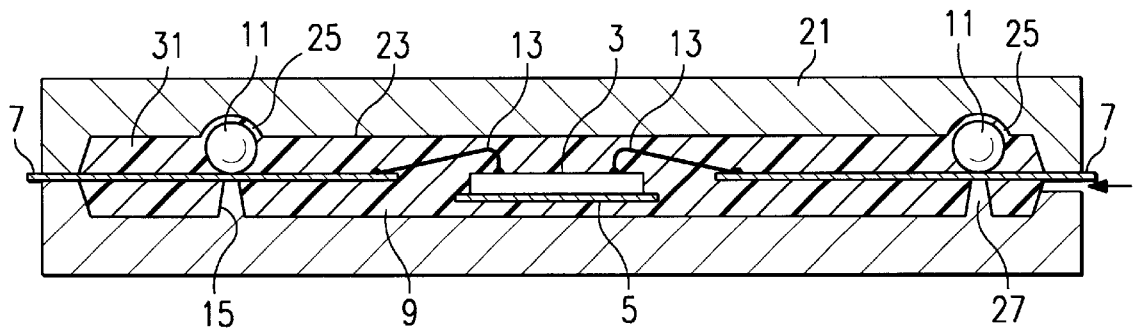
FIG. 3 is a cross sectional view of the package of the present invention during molding showing the mold.
Figure 4:
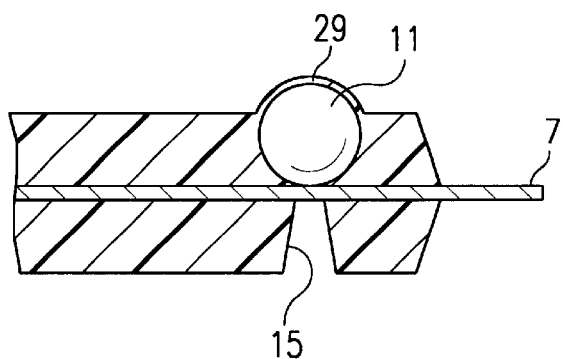
FIG. 4 is an enlarged view of a portion of the package and mold of FIG. 3.
Figure 5:
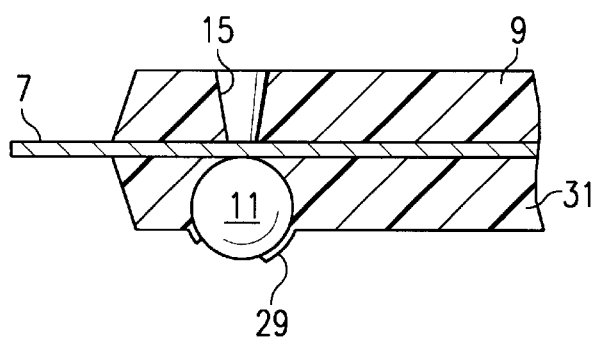
FIG. 5 is a cross-sectional view of a portion of the completed package after molding and prior to flash removal, if required.

With reference to FIGS. 3 and 4, the molding procedure wherein the encapsulant 31 is formed over the surface of the package is explained in greater detail. The assembly is placed in a mold cavity of a mold 21 wherein the balls 11 contact recesses 25 in the wall 23 of the mold cavity which accommodate the balls. The recesses 25 can, for example, have a diameter less than that of the associated ball 11 so that the edges of the recesses contact the balls along a continuous path, thereby preventing any or at most minimal flash from forming over the surface of the ball within the recess. Alternatively, the recesses 25 can be designed to have approximately the same diameter as the balls 11 with some flash to be expected in this case. As can be seen, the plastic package 9 includes apertures 15 under the ball 11 associated with each lead frame lead 7 and the mold cavity includes a bottom mold member 27 which fits into each cavity and forces each of the balls 11 against the associated recess 25. Accordingly, when molding takes place, the portions of the balls 11 unexposed to the encapsulant 31 are essentially free of flash or have only minimal flash 29 thereon. The flash 29, if any, is then removed by any method which will not remove the palladium coating previously placed over the lead frame and ball. In general, chemical etching is preferred, generally with an acid etchant which will etch the plastic and not the palladium, since palladium is quite noble and not readily attacked by standard plastic etchants. A portion of the completed package is shown in FIG. 5 with a small amount of flash 29 thereon which has not yet been removed.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modification.

What is claimed is:

1. A method of making a ball grid array package comprising the steps of:
   (a) providing a partially fabricated package having a semiconductor die having die pads, leads and balls secured to predetermined ones of said leads;
   (b) then concurrently coating said leads and said balls with palladium; and
   (c) then encapsulating said die, leads and at least a portion of each of said balls.

2. The method of claim 1 further including the step of coating said balls with a layer of nickel prior to said coating with palladium.

3. The method of claim 1 further including providing a lead frame including said leads.

4. The method of claim 1 wherein said step of encapsulation includes the steps of:
   (c) providing a mold including a plurality of recesses, each of said recesses for receiving one of said balls;
   (d) providing a plurality of cavities in said package, each of said cavities extending to one of said leads at the location of one of said balls;
   (e) providing a plurality of mold members, each of said mold members extendable into one of said cavities to apply a force against the ball associated with said lead to which said cavity extends;
   (f) placing said partially fabricated package of step (a) into said mold so that said balls extend into said recesses and said mold members extends into said cavities; and
   (g) applying a molding material to said mold cavity to provide said encapsulation.

5. The method of claim 3 further including the step of coating said balls with a layer of nickel prior to said coating with palladium.

6. The method of claim 3 wherein said step of encapsulation includes the steps of:
   (c) providing a mold including a plurality of recesses, each of said recesses for receiving one of said balls;
   (d) providing a plurality of cavities in said package, each of said cavities extending to one of said leads at the location of one of said balls;
   (e) providing a plurality of mold members, each of said mold members extendable into one of said cavities to apply a force against the ball associated with said lead to which said cavity extends;
   (f) placing said partially fabricated package of step (a) into said mold so that said balls extend into said recesses and said mold members extends into said cavities; and
   (g) applying a molding material to said mold cavity to provide said encapsulation.

7. The method of claim 6 further including the step of coating said balls with a layer of nickel prior to said coating with palladium.

8. The method of claim 6 wherein said recesses are circular and wherein the diameter of the circular recess at the interior surface of said mold is less than the diameter of the ball associated with said recess.

9. The method of claim 8 further including the step of coating said balls with a layer of nickel prior to said coating with palladium.

10. The method of claim 4 further including the step of coating said balls with a layer of nickel prior to said coating with palladium.

11. The method of claim 4 wherein said recesses are circular and wherein the diameter of the circular recess at the interior surface of said mold is less than the diameter of the ball associated with said recess.

12. The method of claim 11 further including the step of coating said balls with a layer of nickel prior to said coating with palladium.

* * * * *